United States Patent [19]
Suzuki

[11] 3,889,202

[45] June 10, 1975

[54] MUTING CIRCUIT

[76] Inventor: Tadao Suzuki, 3-22-22 Kamineguro, Meguro-ku, Tokyo, Japan

[22] Filed: Nov. 14, 1973

[21] Appl. No.: 415,740

[30] Foreign Application Priority Data

Nov. 20, 1972 Japan .............................. 47-133529

[52] U.S. Cl. ........................ 330/51; 330/13; 330/29

[51] Int. Cl. ................................................ H03g 3/30

[58] Field of Search .............. 330/11, 207 P, 51, 29, 330/13; 317/33 R; 325/402, 403; 179/1 P, 100.2 K

[56] References Cited

UNITED STATES PATENTS

| | | | |
|---|---|---|---|
| 3,564,338 | 2/1971 | Teshirogi | 330/11 X |
| 3,668,545 | 6/1972 | Von Recklinghausen | 330/207 P |
| 3,681,659 | 8/1972 | Suzuki | 330/51 X |

*Primary Examiner*—James B. Mullins

[57] ABSTRACT

A muting circuit includes a voltage detecting circuit for detecting a change in voltage of a voltage source and includes a switching transistor connected across an input terminal of an output transistor in a power amplifier, the combination thereof being operative to attenuate the drive signal of the output transistor in accordance with an output of the voltage detecting circuit.

8 Claims, 3 Drawing Figures

MUTING CIRCUIT

BACKGROUND OF THE INVENTION

1. Field of the Invention

This invention relates generally to a muting circuit, and more particularly to a muting circuit which is applicable to an audio power amplifier.

2. Description of the Prior Art

Power amplifier having a load of the direct coupled type, upon the rising and the falling of a power source voltage, have been disclosed in the past in which the DC level at the output terminal of the power amplifier varies transiently and causes generation of a noise in a speaker and this sometimes breaks the speaker.

To avoid such an accident, there has been known a method in which a relay is inserted between the output terminal and the speaker. This method, however, has the drawbacks that it lacks reliability and is expensive.

Further, a method has also been known in which a time constant circuit is connected to a bias circuit for a transistor which is provided at the pre-stage of a power amplifier to stop the amplifying operation of the transistor during the time interval when the power source voltage rises to a normal voltage after a power source switch is turned on. With such a method, a pop noise, which is sometimes produced upon falling down of the power source, can not be avoided.

SUMMARY OF THE INVENTION

It is a main object of this invention to provide a muting circuit which is free from the drawbacks encountered in the prior art and which is effective when used in an audio power amplifier.

It is another object of this invention to provide a novel muting circuit for avoiding a noise which may be produced from a speaker when a DC voltage at the output terminal of a power amplifier of the direct coupled load type varies at the rising and falling of the power source voltage.

It is a further object of this invention to provide a muting circuit which is provided with a detecting circuit for detecting the voltage of a power source and with a switching transistor connected to the input terminal of a power amplifier to control the latter with the output from the former.

It is a further object of this invention to provide a muting circuit which is provided with a detecting circuit for detecting the voltage of a power source and a switching transistor connected between the base electrode of an output transistor of a power amplifier and the ground to control the switching transistor with the output from the detecting circuit and hence attenuate a drive signal for the output transistor.

It is a still further object of this invention to provide a muting circuit in which, when an undesirable DC voltage is produced at the output terminal of a direct coupled load type power amplifier after the rising of a power source voltage, the undesirable DC voltage is clamped under a predetermined value.

DESCRIPTION OF THE PREFERRED EMBODIMENTS

An example in which a muting circuit of this invention is adapted to a stereo power amplifier will be hereinbelow described with reference to FIG. 1.

Figure 1:
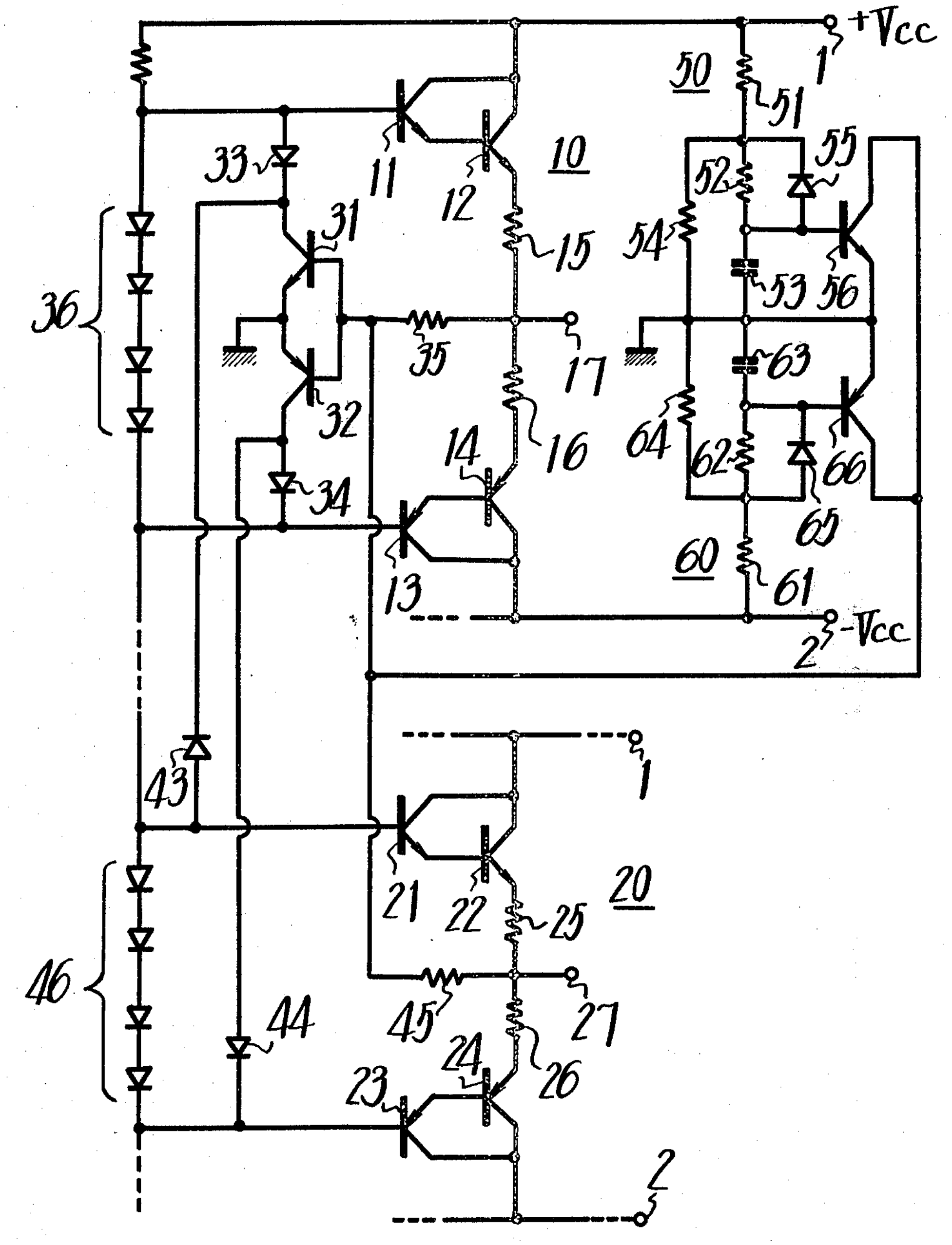
FIG. 1 is a circuit diagram for showing a preferred embodiment of the muting circuit according to the invention.

In FIG. 1, reference numeral 10 generally designates an output stage of a stereo power amplifier for the left-channel thereof and reference numerals 11 to 14 designate its output transistors which are connected in a manner of single-ended-push-pull (SEPP) through resistors 15 and 16. An output terminal 17 is led out from the connection point between the resistors 15 and 16 and a load (not shown) is directly connected to the output terminal 17. Diodes 36 are used as bias diodes for the output transistors. The power amplifier is made as a two power source system, so that positive and negative power source voltages +Vcc and −Vcc are applied thereto from terminals 1 and 2, respectively.

In FIG. 1, reference numeral 20 generally designates the output stage of a power amplifier for the right-channel and 21 to 24 its output transistors which are also connected in a manner of single-ended-push-pull (SEPP) through resistors 25 and 26. An output terminal 27 is led out from the connection point between the resistors 25 and 26. Reference numeral 46 indicates bias diodes for the output transistors 21 to 24.

In the example of FIG. 1, switching transistors 31 and 32 are provided in such a manner that their collector-emitter path is connected between the base circuit of the transistors 11 and 13. The emitter electrodes of the transistors 31 and 32 are together grounded and their collector electrodes are connected through diodes 33 and 34 to the base electrodes of the transistors 11 and 13, respectively. The base electrodes of the transistors 31 and 32 are connected together to the output terminal 17 through a resistor 35. The collector electrodes of the transistors 31 and 32 are further connected to the base electrodes of the transistors 21 and 23 through diodes 43 and 44, respectively, and the base electrodes of the transistors 31 and 32 are together connected to the output terminal 27 through a resistor 45.

The embodiment of the invention shown in FIG. 1 further is provided with detecting circuits 50 and 60 for detecting the power source voltages +Vcc and −Vcc, respectively. The detecting circuits 50 and 60 operate in such a manner that when the power source voltages +Vcc and −Vcc are normal, the transistors 31 and 32 are turned off by the outputs from the detecting circuits 50 and 60, while upon a rising and falling of the voltages +Vcc and −Vcc the transistors 31 and 32 are turned on by the outputs from the detecting circuits 50 and 60, respectively.

The detecting circuit 50 is formed as follows. A series connection of resistors 51 and 52 and a capacitor 53 is connected between the terminal 1 and the ground. The connection point between the resistors 51 and 52 is grounded through a resistor 54 and also is connected to the connection point between the resistor 52 and the capacitor 53 through a diode 55. The connection point between the resistor 52 and the capacitor 53 is further connected to the base electrode of a transistor 56, the emitter electrode of which being grounded and the collector electrode of which being connected to the base electrodes of transistors 31 and 32. Thus, the detecting circuit 50 is formed.

The other detecting circuit 60 is formed similarly, so that the corresponding elements are shown with reference numerals 61 to 66 and the description on their connection is omitted for the sake of brevity.

With such a circuit construction as above described, when the power is supplied thereto, the capacitors 53 and 63 are charged up through the resistors 51, 52 and 61, 62, respectively. In this case, the transistors 56 and 66 are kept off during the charging time period of the capacitors 53 and 63, so that if the DC level of the outputs at the terminals 17 and 27 varies by the rising and falling of the power source voltages +Vcc and −Vcc when the power is supplied, the transistor 31 or 32 is turned on with the DC voltages (which one of the transistors 31 and 32 is turned on depends upon the polarity of the DC voltages) and the base electrodes of the transistors 11 and 21 or 13 and 23 are clamped at the terminal voltage of the diode 33 or 34, namely at about +0.6 or −0.6 volts. Accordingly, the DC voltage due to the level variation of the outputs at the terminals 17 and 27 is also clamped at about +0.6 volts or −0.6 volts, or is not heightened or lowered beyond the above value in the DC level. That is, even if the DC level variation occurs in the outputs at the terminals 17 and 27 when power is supplied, the variation is suppressed and a muting operation is performed.

If the elements 51 to 54 and 61 to 64 are suitably selected in value, after the power source voltage has risen sufficiently, the capacitors 53 and 63 are charged up completely to place the transistors 56 and 66 in the on state and hence to turn the transistors 31 and 32 off. Therefore, amplified outputs are delivered to the terminals 17 and 27, respectively. In this case, the transistors 31 and 32 are prevented from being turned on between their collector and base electrodes during a half cycle of the amplified output by the diodes 33, 43 and 34, 44, respectively.

On the other hand, when the power source is cut away, the power source voltages +Vcc and −Vcc falls. At this time, the capacitors 53 and 63 are discharged rapidly through the diodes 55, 65 and the resistors 54, 64 to cause the transistors 56 and 66 to be turned off immediately. Accordingly, if the DC level of the outputs at the terminals 17 and 27 is changed when the power source is cut, the transistor 31 or 32 is turned on by the DC voltage to carry out the muting operation.

As described above, with the present invention, the muting operation is achieved when the power source is turned on and off. In this case, since the transistors 31 and 32 are connected in the base circuits of the transistors 11, 21 and 13, 23, the small capacity of transistors can be used as the transistors 31 and 32 and hence the circuit becomes simple in construction and cheap. Further, the transistors 31 and 32 are turned on by the DC voltage itself which is produced at the terminals 17 and 27, so that the operation of the circuit becomes positive.

Figure 2:
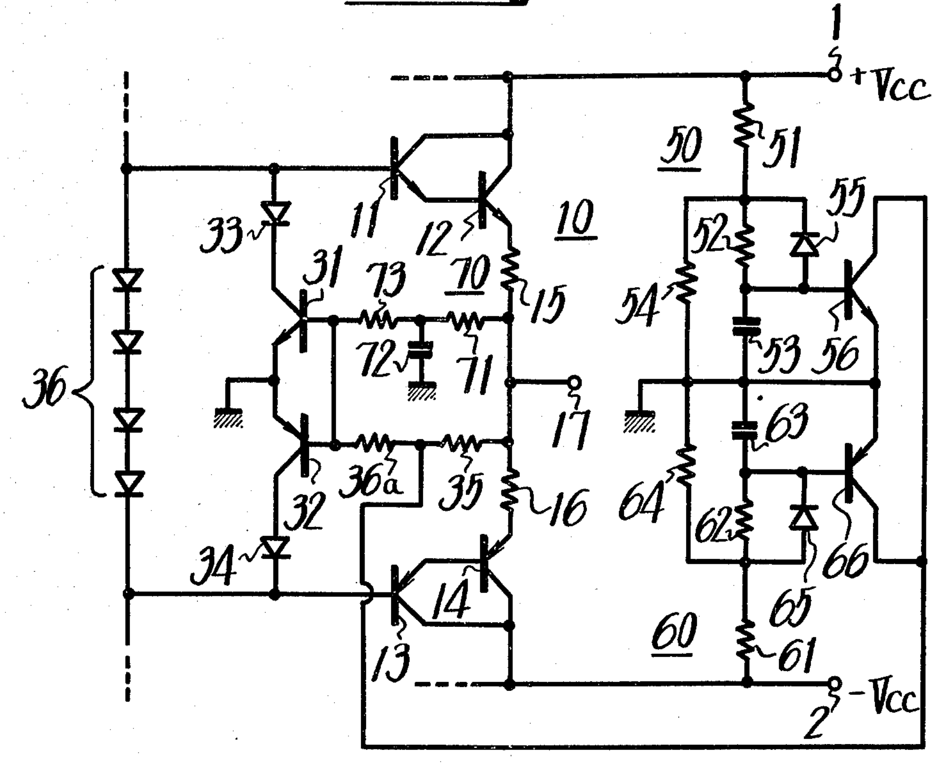
FIG. 2 is a circuit diagram for showing another preferred embodiment of the muting circuit of the invention in which an undesirable DC voltage which may be produced at the output terminal of a power amplifier after a rising power voltage has been clamped.

FIG. 2 shows another example of the invention in which a muting circuit as described above is provided and also a protective circuit is provided for protecting a speaker from an abnormal DC voltage at the terminal 17 which may be produced after the power source voltage has risen up. In FIG. 2, reference numerals the same as those of FIG. 1 represent the same element. In this example, a resistor 36*a* is connected in series to the resistor 35 and the connection point therebetween is connected to the collector electrodes of the transistors 56 and 66 to form the muting circuit. The terminal 17 is connected to the base electrodes of the transistors 31 and 32 through a low pass filter 70 which consists of a resistor 71, a capacitor 72 and a resistor 73, in this example, to form the protective circuit.

With the example shown in FIG. 2, the muting circuit operates the same as in that of FIG. 1 to achieve the muting operation, and if an abnormal DC voltage is produced at the terminal 17 when the circuit performs an amplification operation, the abnormal DC voltage is supplied through the filter 70 to the transistors 31 and 32 to turn them on. Thus, the voltage at the terminal 17 is clamped at a DC level such as about +0.6 volts or −0.6 volts and hence a speaker (not shown) connected to the terminal 17 is prevented from being supplied with an abnormal voltage, and thus protection for the speaker is achieved. Further, the amplified output at the terminal 17 is prevented from being passed to the transistors 31 and 32 by the filter 70, so that the amplified output does not turn the transistors 31 and 32 on.

If the example shown in FIG. 2 is constructed similar to that of FIG. 1, the muting operation to the power amplifier of the other channel and the protection of the speaker can also be achieved.

Figure 3:
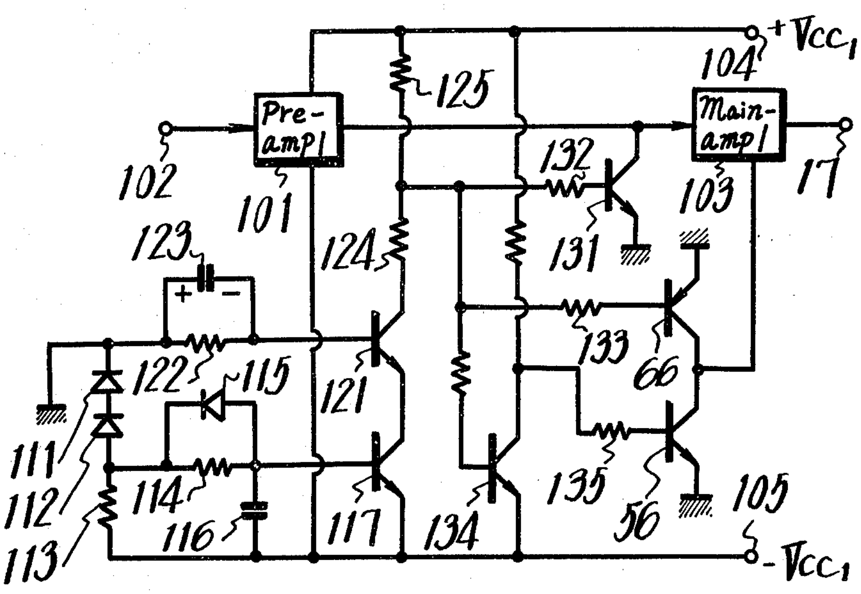
FIG. 3 is a circuit diagram for showing a further preferred embodiment of the invention in which a switching transistor is provided at the input terminal of a power amplifier.

FIG. 3 shows a further embodiment of the invention in which the muting circuit is provided at the input side of the power amplifier and a circuit for detecting the power source voltage different in construction from that shown in FIG. 1 is provided.

More particularly, in FIG. 3, reference numeral 101 designates a pre-amplifier, 102 its input terminal, and 103 a main or power amplifier. In this example, the pre-amplifier 101 is a kind of two power source system and is driven with positive and negative voltages $+Vcc_1$ and $-Vcc_1$ from terminals 104 and 105. A series connection of constant voltage diodes 111 and 112 and a resistor 113 is connected between the ground and the terminal 105. The connection point between the diodes 112 and the resistor 113 is connected to the terminal 105 through a parallel connection of a resistor 114 and a diode 115 and also through a series connection with a capacitor 116. The base and emitter electrodes of a transistor 117 for switching are connected in parallel to the capacitor 116. Another switching transistor 121 is provided in such a manner that its base electrode is grounded through a parallel connection of a resistor 122 and a capacitor 123, its emitter electrode being connected to the collector electrode of the transistor 117 and its collector electrode being connected to the terminal 104 through a series connection of resistors 124 and 125, respectively.

A third switching transistor 131 is provided such that its collector and emitter electrodes are connected between the output terminal of the pre-amplifier 101 and the ground and its base electrode is connected through a resistor 132 to the connection point between the resistors 124 and 125. This connection point is connected through a resistor 133 to the base electrode of the transistor 66 and also to the base electrode of a transistor 134 for reversing the phase of a signal. The emitter electrode of the transistor 134 is connected to the terminal 105 and its collector electrode is connected through a resistor 135 to the base electrode of the transistor 56. The emitter electrodes of the transistors 56 and 66 are both grounded and their collector electrodes are together connected to the transistors 31 and 32 (not shown) of the power amplifier 103, similar to the case shown in FIGS. 1 and 2.

With the circuit described as above, when electric power is supplied thereto, a voltage is instantaneously produced across the resistor 113. The voltage is applied through the resistor 114 to the capacitor 116 to charge up the same. In this case, since the transistor 117 is kept off during the time period when the capacitor 116 is charged up, the transistor 131 is turned on and hence the output terminal of the pre-amplifier 101 is grounded. Thus, even if a noise signal is transiently produced in the pre-amplifier 101 by the rising of the power source voltages $+Vcc_1$ and $-Vcc_1$, the noise signal is by-passed through the transistor 131 to the ground, which means that the muting operation is performed for the pre-amplifier 101. In this case, when the transistor 131 is turned on, the transistor 66 is turned off, the transistor 134 goes on and the transistor 56 goes off, so that the transistors 31 and 32 (not shown) are turned on. Thus, the muting operation for the power amplifier 103 is also performed simultaneously.

In the example of FIG. 3, if the time constant determined by the resistor 114 and the capacitor 116 is selected properly, after the power source voltages $+Vcc_1$ and $-Vcc_1$ have risen and the noise signal has disappeared, the transistor 117 is turned on, and the transistor 121 is turned on by the base current thereof applied thereto through the resistor 122 and hence the transistor 131 goes off. As a result, the amplified output from the preamplifier 101 is supplied to the power amplifier 103. At this time, the transistors 56 and 66 are turned on simultaneously, so that the transistors 31 and 32 (not shown) in the power amplifier 103 are turned off to deliver an amplified output to the terminal 17. At this time, the capacitor 123 is charged up with the polarity shown in FIG. 3.

On the other hand, when the power source is cut off, the power source voltages $+Vcc_1$ and $-Vcc_1$ approach zero. Accordingly, the transistor 121 is turned off because it is reversely biased by the charge stored in the capacitor 123. Thus, the transistor 131 is turned on so that even if a noise is transiently produced in the pre-amplifier 101 caused by the falling down of the power source voltages $+Vcc_1$ and $-Vcc_1$ when the power source is cut off, the noise is by-passed to the ground through the transistor 131. That is, the muting operation is carried out for the pre-amplifier 101. At this time since the transistors 56 and 66 are turned off, the muting operation for the power amplifier 103 is also carried out.

It is possible for the collector and emitter path of the transistors 31 and 32 to be connected in series to the base electrodes of the transistors 11 and 13, respectively, and their on-off control would then be achieved reversely from that described above.

It is also possible to have the circuit of FIG. 3 driven from a tape recorder or deck in place of the pre-amplifier 101.

Further, the detecting circuit for the power source voltage may be provided for detecting the power source voltage at the power amplifier instead of that at the pre-amplifier.

It will be apparent to those skilled in the art that many modifications and variations can be effected without departing from the spirit and scope of the novel concepts of the invention. Accordingly, the scope of the invention should be determined by the appended claims.

I claim as my invention:

1. A muting circuit comprising:

a. first and second voltage sources;

b. a pre-amplifier connected across the first voltage source;

c. voltage detecting means for the first voltage source;

d. a power amplifier having an input terminal and first and second output transistors whose collector and emitter are connected in series to each other across the second voltage source, the connection point between said first and second transistors being connected to an output terminal;

e. first switching means connected to the bases of the first and second transistors, the output terminal and a reference point, and operative to clamp the base of the first and second transistors into a predetermined DC voltage in response to an output signal of the voltage detecting means; and f. second switching means connected between the input terminal and the reference point, and operative to attenuate a drive signal of the power amplifier in response to the output signal of the voltage detecting means.

2. A muting circuit according to claim 1, wherein said voltage detecting means includes a time constant circuit having a resistor and a capacitor connected across said voltage source and a switching transistor which produces a control signal controlling by the time constant circuit.

3. A muting circuit comprising:

a. a voltage source;

b. first and second transistors whose collector-emitter are substantially connected in series to each other with complementary polarities across said voltage source;

c. an output terminal connected to the connection point between said first and second transistors to which a load is connected directly;

d. first means for detecting a DC voltage at said output terminal;

e. a reference point;

f. second means for detecting the voltage of said voltage source, said means including a time constant circuit connected between said voltage source and said reference point and a switching transistor controlled by the output of said time constant circuit to produce a control signal;

g. switching means including first and second muting transistors whose emitters are connected to each other and to said reference point, and whose collectors are connected to the bases of said first and second transistors respectively, and said switching means controlled by the output of said first means and the control signal from said second means and operative to clamp the base electrodes of said first and second transistors at a predetermined DC voltage.

4. A muting circuit according to claim 3, wherein said time constant circuit includes first and second resistors connected in series across the voltage source, a third resistor and a capacitor connected in series across said second resistor, a diode connected in parallel with said third resistor, an output terminal connected to a connection point between said diode and said capacitor and the base of the switching transistor.

5. A muting circuit according to claim 3, wherein said switching means further includes a pair of diodes connected between the collectors of said first and second muting transistors and the bases of said first and second transistors respectively with the same polarity as said first and second muting transistors.

6. A muting circuit according to claim 3, further including:

a. first and second resistors which are connected in series between the base of one of said first and second muting transistors and the output terminal, the connection point between said resistors being supplied with said control signal from said second means;

b. a low pass filter connected between the base of the other of said first and second muting transistors and the output terminal; and c. means for coupling the bases of said first and second muting transistors to each other.

7. A muting circuit comprising:

a. a voltage source;

b. first and second transistors whose collector-emitters are connected in series to each other with complementary polarities across said voltage source;

c. an output terminal connected to the connection point between said first and second transistors to which a load is connected directly;

d. first means for detecting a DC voltage at said output terminal;

e. second means for detecting a voltage of said voltage source, which produce a control signal in response to the voltage value of said voltage source, said second means including first and second time constant circuits connected in series to each other across said voltage source, and first and second switching transistors whose bases are connected to the output terminals of said first and second time constant circuits respectively, and controlled by the output of at least one of said first and second time constant circuits; and f. switching means connected between the base electrodes of said first and second transistors, controlled by the output of said first means and the control signal from said second means and operative to clamp both base electrodes of said first and second transistors at a predetermined DC voltage, said switching means including first and second muting transistors, whose emitters are connected to each other and to ground, and whose collectors are connected to the bases of said first and second transistors, respectively.

8. A muting circuit comprising:

a. a voltage source;

b. a first SEPP amplifier having a first pair of input terminals and a first output terminal, and connected across said voltage source, said first output terminal being connected to a first load directly;

c. a second SEPP amplifier having a second pair of input terminals and a second output terminal, and connected across said voltage source, said second output terminal being connected to a second load directly;

d. a reference point;

e. a first time constant circuit having a first resistor and a first capacitor, said first resistor and first capacitor being connected in series to each other between one terminal of the voltage source and said reference point;

f. a first switching transistor whose base-emitter is connected across said first capacitor and whose emitter is connected to the reference point;

g. a first muting transistor whose collector is connected to one of said first pair of input terminals of the first SEPP amplifier and to one of said second pair of input terminals of the second SEPP amplifier and whose emitter is connected to said reference point, and whose base is connected to the collector of said first switching transistor and the first output terminal;

h. a second time constant circuit having a second resistor and a second capacitor, said second resistor and second capacitor being connected in series to each other between the other terminal of the voltage source and said reference point;

i. a second switching transistor whose base-emitter is connected across said second capacitor and whose emitter is connected to said reference point; and j. a second muting transistor whose collector is connected to the other of said first pair of input terminals of said first SEPP amplifier and to the other of said second pair of input terminals of said second SEPP amplifier, and whose emitter is grounded, and whose base is connected to the first and second output terminals.

* * * * *